US009952519B2

United States Patent
Roos et al.

(10) Patent No.: US 9,952,519 B2
(45) Date of Patent: Apr. 24, 2018

(54) VACUUM LINEAR FEED-THROUGH AND VACUUM SYSTEM HAVING SAID VACUUM LINEAR FEED-THROUGH

(71) Applicant: Carl Zeiss SMT GmbH, Oberkochen (DE)

(72) Inventors: Matthias Roos, Aalen (DE); Eugen Foca, Lauchheim (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 15/481,619

(22) Filed: Apr. 7, 2017

(65) Prior Publication Data

US 2017/0212428 A1 Jul. 27, 2017

Related U.S. Application Data

(63) Continuation of application No. PCT/EP2015/071864, filed on Sep. 23, 2015.

(30) Foreign Application Priority Data

Oct. 7, 2014 (DE) .................. 10 2014 220 220

(51) Int. Cl.
  *G03G 15/00* (2006.01)
  *G03F 7/20* (2006.01)
(52) U.S. Cl.
  CPC ............................ *G03F 7/70708* (2013.01)
(58) Field of Classification Search
  CPC ............ G03F 7/70841; G03F 7/70916; G03F 7/70708; A47L 9/9242

(Continued)

(56) References Cited

U.S. PATENT DOCUMENTS

2002/0175480 A1 11/2002 Tatzreiter
2006/0191484 A1 8/2006 Mitrovic et al.
(Continued)

FOREIGN PATENT DOCUMENTS

DE  3420834 A1  12/1985
JP  2001024045 A1  1/2001

OTHER PUBLICATIONS

Office Action in corresponding German Application 102014220220. 5, dated Jul. 23, 2015, along with English Translation.

(Continued)

*Primary Examiner* — Hung Henry Nguyen
(74) *Attorney, Agent, or Firm* — Edell Shapiro & Finnan, LLC

(57) ABSTRACT

A vacuum linear feed-through (20), e.g., for an EUV lithography system, includes: a vacuum diaphragm bellows (21), which has a first end (21a) attaching a component and a second end (21b), opposite the first end, attaching to a vacuum housing, and an actuator device (27) generating a linear reciprocating motion of the bellows. The feed-through has at least one first shield (30, 30'), connected to the bellows at the first end, and at least one second shield (31, 31'), connected to the bellows at the second end. The first and second shield annularly surround the bellows, and the first and second shield overlap in the longitudinal direction of the bellows (21). At least one first shield and at least one second shield are formed of a permanently magnetic material, and/or the feed-through has a voltage-generating device (33) generating an electric field (E) between the first shield and the second shield.

13 Claims, 2 Drawing Sheets

(58) Field of Classification Search
USPC .................................... 355/133; 285/7, 24
See application file for complete search history.

(56) References Cited

U.S. PATENT DOCUMENTS

| | | |
|---|---|---|
| 2009/0200268 A1 | 8/2009 | Tappan et al. |
| 2009/0246374 A1 | 10/2009 | Vukovic |
| 2010/0140917 A1* | 6/2010 | Sheremeta ............... A47L 5/38 285/7 |
| 2011/0032505 A1 | 2/2011 | Lansbergen et al. |

OTHER PUBLICATIONS

International Search Report and Written Opinion in counterpart International Application No. PCT/EP2015/071864, dated Apr. 20, 2017, 19 pages.

* cited by examiner

VACUUM LINEAR FEED-THROUGH AND VACUUM SYSTEM HAVING SAID VACUUM LINEAR FEED-THROUGH

CROSS REFERENCE TO RELATED APPLICATION

This is a Continuation of International Application PCT/EP2015/071864 which has an international filing date of Sep. 23, 2015, and the disclosure of which is incorporated in its entirety into the present Continuation by reference. The following disclosure is also based on and claims the benefit of and priority under 35 U.S.C. § 119(a) to German Patent Application No. DE 10 2014 220 220.5, filed Oct. 7, 2014, the entire disclosure of which is incorporated by reference into the present Continuation application.

FIELD OF THE INVENTION

The invention relates to a vacuum linear feed-through, comprising: a vacuum diaphragm bellows, which has a first end for attaching a component and a second end, opposite the first end, for attaching to a vacuum housing, and an actuator device for generating a linear reciprocating motion of the vacuum diaphragm bellows in the longitudinal direction of the vacuum diaphragm bellows. The invention further relates to a vacuum system, in particular an EUV (extreme ultraviolet) lithography system, with at least one such vacuum linear feed-through.

BACKGROUND

Vacuum linear feed-throughs serve for introducing linear motion into the vacuum, i.e. for generating a linear movement of a component which is exposed to the vacuum environment, with an actuator device. The actuator device typically has a drive which causes an expansion or contraction of the vacuum diaphragm bellows and moves the first end of the vacuum diaphragm bellows with the component relative to the second, stationary end of the vacuum diaphragm bellows. The actuator device can, for example, have a manual drive or an electrical drive. The vacuum diaphragm bellows is suitable for use in a vacuum environment and serves to provide a seal between a vacuum side, on which the component is mounted, and an atmosphere side, on which the actuator device or parts of the actuator device are mounted, typically at least the drive.

Diaphragm bellows for vacuum applications or for ultra-high vacuum applications are typically made of stainless steel and have a plurality of folds or corrugations. The folds or corrugations can be formed with several substantially annular stainless steel parts being welded to each other. Alternatively, the wave shape of the diaphragm bellows can be generated by plastic deformation of the stainless steel membrane. After a multiplicity of adjustment movements, i.e. after a multiplicty of successive contractions and expansions of the diaphragm bellows, particles may be generated in the area of the weld seams, for example, and may undesirably pass to the vacuum side of the vacuum diaphragm bellows and spread out in the vacuum environment of the bellows in an uncontrolled manner.

SUMMARY

An object of the invention is to make available a vacuum linear feed-through and a vacuum system with at least one such vacuum linear feed-through, which generates fewer such particles to be introduced into a vacuum environment.

This object is achieved by a vacuum linear feed-through of the aforementioned type, comprising: at least one first shield, which is connected (rigidly) to the vacuum diaphragm bellows at the first end, and at least one second shield, which is connected (rigidly) to the vacuum diaphragm bellows at the second end. The at least one first and second shield annularly surround the vacuum diaphragm bellows, and the at least one first and second shield overlap in the longitudinal direction of the vacuum diaphragm bellows.

The introduction of particles into the vacuum environment or to the vacuum side of the vacuum diaphragm bellows can be reduced if the vacuum linear feed-through has at least two shields which are arranged on the vacuum side of the vacuum diaphragm bellows and which, for each permissible or possible stroke in the linear reciprocating motion, mutually overlap in the longitudinal direction of the vacuum diaphragm bellows, such that no free line of sight exists between the vacuum diaphragm bellows and the vacuum environment.

It will be appreciated that, at least in the partial region in which the first and the second shield mutually overlap, they are offset in relation to each other in a direction transverse to the longitudinal direction of the vacuum diaphragm bellows, particularly in the radial direction. Between mutually adjacent first and second shields, a gap is thus formed with a comparatively small width of, for example, less than 1 mm. The shields are typically rigid, i.e. they do not change their length during the contraction and expansion of the vacuum diaphragm bellows.

If the vacuum linear feed-through has more than two first and second shields, a particle labyrinth is formed by the gaps formed between the respective shields in the partial region of the overlap. The greater the number of mutually engaging pairs of first and second shields, the higher is the suppression factor for any particles separated from the vacuum diaphragm bellows.

The vacuum side of the vacuum diaphragm bellows can be arranged radially to the inside or radially to the outside in relation to the vacuum diaphragm bellows. Correspondingly, the first and second shields surround the vacuum diaphragm bellows either radially to the inside or radially to the outside. The connection of the first and the second shield to the first and the second end of the vacuum diaphragm bellows can be produced, for example, by a respective base body, for example a base plate, on which both the respective end of the vacuum diaphragm bellows and also the respective shield is rigidly secured (e.g. welded on).

Both the length of the first shield and the length of the second shield in the longitudinal direction of the vacuum diaphragm bellows is smaller than the length of the vacuum diaphragm bellows in its fully expanded position, i.e. the shields do not surround the vacuum diaphragm bellows in the longitudinal direction along its entire length. This is necessary, since otherwise no contraction of the vacuum diaphragm bellows would be possible on account of the rigidity of the shields.

For the overlapping of the two shields, it is necessary that the sum of the lengths of the two shields is greater than the length of the vacuum diaphragm bellows in its fully expanded position. The larger the partial region along which the first and second shield overlap, the more effective the particle suppression. However, when choosing the lengths of the two shields, account should be taken of the maximum stroke, i.e. the maximum length by which the component secured on the first end is to be moved. The greater the lengths of the shields in relation to the total length of the vacuum diaphragm bellows, the smaller is the stroke that can be achieved with the vacuum linear feed-through.

In an advantageous embodiment, at least one first shield and at least one second shield are formed of a permanently magnetic material. The inventor has recognized that the efficiency of the particle suppression can be considerably increased if at least one first shield and one second shield are made of a permanently magnetic material which attracts magnetic or magnetizable particles, since particles of this kind attach themselves to the surface of the permanently magnetic material of the respective shield. The efficiency of the magnetic particle suppression can be further increased if the vacuum diaphragm bellows itself is made of a material that generates magnetizable or magnetic particles. Therefore, the vacuum diaphragm bellows can itself be formed particularly of a permanently magnetic material or, if appropriate, a paramagnetic material, for example a suitable steel (see below).

The first shield and second shield, which are formed of the permanently magnetic material, can be in the form, for example, of two radially adjacent shields which in particular can be arranged immediately adjacent to the vacuum diaphragm bellows in the radial direction. Compared to the use of shields made of non-permanently magnetic material, the use of shields made of permanently magnetic material permits a considerable reduction in the number of shields and, therefore, in the installation space, while maintaining the same effectiveness in terms of particle suppression.

In one development, the permanently magnetic material is chosen from the group comprising: martensitic steel or ferritic steel. The martensitic or ferritic steel should be easily weldable and corrosion-resistant. Steels that are only partially magnetic, for example duplex steel, which has a ferrite matrix with austenitic islands, are less well suited for magnetic particle suppression.

In a further embodiment, at least one first shield and at least one second shield are formed of a paramagnetic material. An in particular annular shield made of a paramagnetic material makes it possible to shield magnetic fields that are generated on the vacuum side in the area of the vacuum diaphragm bellows. Paramagnetic materials have a magnetic permeability of $\mu_r>1$.

The paramagnetic material is particularly preferably a mu-metal. A mu-metal is a soft magnetic nickel-iron alloy with a high magnetic permeability of more than 50 000-140 000, for example. It will be appreciated that other paramagnetic materials can also be used for the magnetic shielding, for which they should have the highest possible magnetic permeability.

In a further embodiment, the at least one first and second shield made of the permanently magnetic material are arranged between the at least one first and second shield made of the paramagnetic material and the vacuum diaphragm bellows. In this way, the magnetic field generated by the shields made of the permanently magnetic material can be screened off by the shields made of the paramagnetic material and does not enter the area of the vacuum environment outside the shields. This is expedient, since the occurrence of (additional) magnetic fields there is typically undesired.

In a further embodiment, at least one first shield and at least one second shield have an adhesive coating for particles generated by the vacuum diaphragm bellows on a surface directed toward the vacuum diaphragm bellows and/or on a surface directed away from the vacuum diaphragm bellows. The adhesive coating also allows non-magnetic or non-magnetizable particles to adhere to the surfaces. The material of the adhesive coating can be, for example, a vacuum-compatible acrylic-based coating.

Both the surfaces of shields made of permanently magnetic material and also the surfaces of shields made of paramagnetic material can be provided with an adhesive coating in order to increase the efficiency of the particle suppression. Here, use is made of the fact that the adhesive coating causes adhering particles to experience high adhesion forces which make renewed detachment of the particles even more unlikely. It will be appreciated that an adhesive coating can also be applied to shields which are not made of a permanently magnetic material or of a paramagnetic material. To ensure good cleaning of the surfaces directed toward the vacuum environment (i.e. directed away from the vacuum diaphragm bellows), the surfaces of the first and second shields directed toward the vacuum environment can have a polished surface of very low roughness to which, however, an adhesive coating can also be applied if appropriate.

In a further embodiment, the vacuum linear feed-through comprises a voltage-generating device designed to generate an electric field between a first shield and a second shield which is preferably arranged adjacent to the first shield. The respective shields between which the electric field is generated have to be electrically insulated from one another. Since the first and second shields are connected to one another via the typically electrically conductive vacuum diaphragm bellows, it is typically necessary to electrically insulate them from the vacuum diaphragm bellows. It will be appreciated that the voltage-generating device can also be designed to generate an electric field between more than two first and/or second shields, provided that two of the shields between which an electric field is to be generated are electrically insulated from each other.

The electric field increases the impact probability and the impact energy of the particles on the surfaces of the shields between which the electric field is formed, since the field lines of the electric field are oriented perpendicularly with respect to the surfaces of the shields. Particles located in the space or gap in which the first and second shield(s) overlap each other experience, on account of their polarization or if appropriate their charge on account of the electric field, an additional acceleration toward the surfaces of the shields.

In a further embodiment, the at least one first shield and the at least one second shield are formed as concentrically arranged (circular) cylinders. The axis with respect to which the two shields are arranged concentrically is typically the longitudinal axis of the vacuum diaphragm bellows. The vacuum diaphragm bellows typically also has a (circular) cylindrical shape or geometry. By virtue of the design of the shields in the form of cylinders which are adapted to the geometry of the vacuum diaphragm bellows, the installation space occupied by the vacuum linear feed-through can be kept low. It will be appreciated that geometries other than circular cylinder geometries can also be chosen for the vacuum diaphragm bellows and for the shields, for example square or rectangular geometries.

In a further embodiment, the actuator device comprises a linear guide for guiding the vacuum diaphragm bellows in the linear reciprocating motion in the longitudinal direction of the vacuum diaphragm bellows. Such a linear guide permits precise guiding of the vacuum diaphragm bellows or, to be more exact, of the first end of the vacuum diaphragm bellows on which the linearly displaceable component is secured. A rod, which is connected to the first end of the vacuum diaphragm bellows, can in particular be guided in the linear guide. A for example electrical actuator of the actuator device can engage on the rod directly or indirectly, for example via a further component, in order to displace the rod and therefore the first end of the vacuum diaphragm bellows in the longitudinal direction. Alternatively, in order to generate the reciprocating motion, the rod can remain stationary, and the linear guide in which the rod is mounted can be displaced in the longitudinal direction of the vacuum diaphragm bellows.

The linear guide can be arranged concentrically with respect to the longitudinal axis of the vacuum diaphragm bellows. In this case, the radially outer side, as seen from the vacuum diaphragm bellows, typically forms the vacuum side, while the radially inner side of the vacuum diaphragm bellows forms the atmosphere side. It will be appreciated that atmospheric pressure does not necessarily have to prevail on the atmosphere side, but the pressure on the atmosphere side is typically considerably greater, i.e. several orders of magnitude greater, than the pressure on the vacuum side.

In one embodiment, the linear guide is arranged eccentrically with respect to the longitudinal axis of the vacuum diaphragm bellows. In this case, the area radially surrounding the vacuum diaphragm bellows typically forms the atmosphere side, while the radially inner area of the vacuum diaphragm bellows forms the vacuum side. This has proven advantageous for certain uses.

A further aspect of the invention relates to a vacuum system comprising: a vacuum housing in which a vacuum environment is formed, and at least one vacuum linear feed-through, which is designed as described above, wherein the second end of the vacuum diaphragm bellows is mounted or secured on the vacuum housing. The actuator device or at least the drive of the actuator device is typically arranged outside the vacuum environment which is generated inside the vacuum housing. To generate the vacuum or the vacuum environment in the vacuum housing, the vacuum system typically has one or more vacuum pumps. The vacuum system can in principle be any device in which a vacuum environment is formed in which a component is intended to be moved linearly in a linear movement along a predetermined stroke or along a predetermined distance.

In one advantageous embodiment, the vacuum system is designed as an EUV lithography system. For the purposes of this application, an EUV lithography system is understood as meaning an optical system for EUV lithography, i.e. an optical system that can be used in the field of EUV lithography. Apart from an EUV lithography apparatus, which serves for the production of semiconductor components, the optical system may be for example an inspection system for the inspection of a photomask used in an EUV lithography apparatus (hereinafter also referred to as a reticle), for the inspection of a semiconductor substrate to be structured (hereinafter also referred to as a wafer) or a metrology system, which is used for measuring an EUV lithography apparatus or parts thereof, for example for measuring a projection system. In EUV lithography systems, it is necessary to arrange at least part of the beam path of the optical elements in a vacuum environment. It will be appreciated that the vacuum system can also be another type of optical arrangement in which a vacuum environment is generated.

In a further embodiment, the vacuum system comprises a component which is mounted on the first end of the vacuum linear feed-through. In principle, a large number of different components can be mounted on the first end of the vacuum diaphragm bellows, for example measuring devices or measuring probes or the like, in order, for example, to measure a pressure, a temperature or other variables in the vacuum environment. Particularly in vacuum systems in the form of EUV lithography apparatuses, it is also possible, for example, with the aid of the at least one vacuum linear feed-through, to move at least one cleaning head for cleaning the optical surfaces of optical elements arranged in the vacuum environment. If appropriate, at least one optical element itself can also be moved inside the vacuum environment.

Further features and advantages of the invention emerge from the following description of illustrative embodiments of the invention, on the basis of the figures in the drawing, which show details associated with the invention, and from the claims. The individual features may be realized respectively on their own or together in any combination in various embodiments of the invention.

BRIEF DESCRIPTION OF THE DRAWINGS

Illustrative embodiments are depicted in the schematic drawing and are explained in the following description. In the figures.

DETAILED DESCRIPTION

Identical reference signs are used in the following description of the drawings for components that are the same or functionally analogous to one another.

Figure 1:
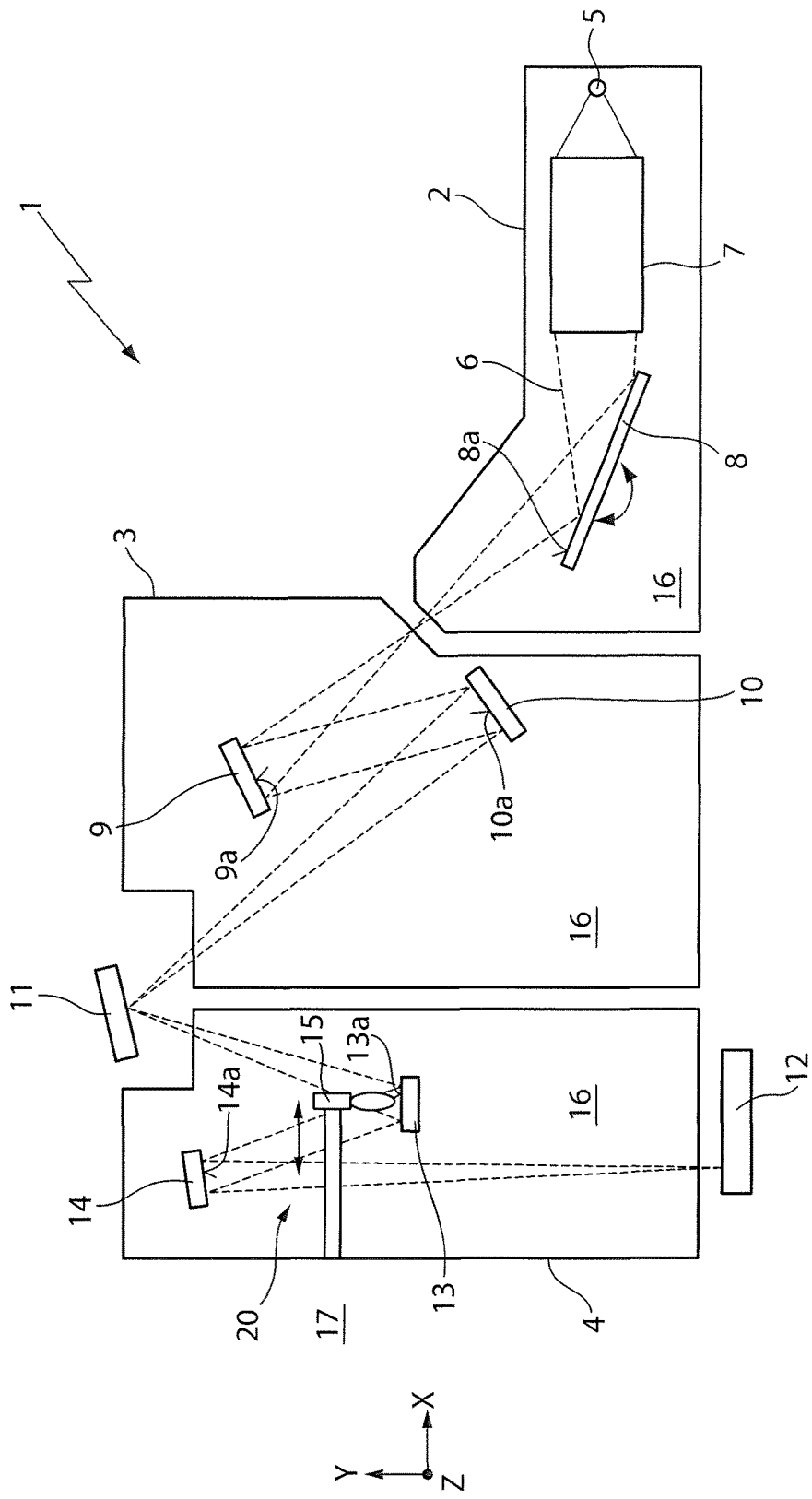
FIG. 1 shows a schematic view of an EUV lithography apparatus.

FIG. 1 shows a schematic view of a vacuum system in the form of an EUV lithography apparatus 1 which consists of a beam-shaping system 2, an illumination system 3 and a projection system 4, which are accommodated in separate vacuum housings and are arranged in succession in a beam path 6 proceeding from an EUV light source 5 of the beam-shaping system 2. To simplify matters, the vacuum housings belonging to the beam-shaping system 2, to the illumination system 3 and to the projection system 4 are designated by the same reference signs as the systems themselves.

A plasma source or a synchrotron can serve as EUV light source 5, for example. The radiation emerging in the wavelength range between about 5 nm and about 20 nm is first focused in a collimator 7. With the aid of a downstream monochromator 8, the desired operating wavelength is filtered out by variation of the angle of incidence, as is indicated by a double-headed arrow. In the stated wavelength range, the collimator 7 and the monochromator 8 are usually designed as reflective optical elements, wherein at least the monochromator 8, on its optical surface, has no multi-layer coating, in order to reflect a wavelength range having the greatest possible bandwidth.

The radiation treated with regard to wavelength and spatial distribution in the beam-shaping system 2 is introduced into the illumination system 3, which has a first and a second reflective optical element 9, 10. The two reflective optical elements 9, 10 guide the radiation onto a photomask 11 as a further reflective optical element, which has a structure that is imaged via the projection system 4 onto a wafer 12 on a reduced scale. For this purpose, a third and a fourth reflective optical element 13, 14 are provided in the projection system 4.

The reflective optical elements 9, 10, 11, 12, 13, 14 respectively have an optical surface 9a, 10a, 11a, 12a, 13a, 14a, which are arranged in the beam path 6 of the EUV lithography apparatus 1. Arranged in the projection system 4 is also a further component 15 which, in the example shown, is designed as a cleaning head which applies a cleaning gas (indicated in FIG. 1), for example in the form of hydrogen, to the optical surface 13a of the first optical element 13 of the projection system 4. The vacuum environment 16 in the projection system 4 is generated with the aid of vacuum pumps (not shown). The overall pressure in the vacuum environment 16 of the beam-shaping system 2, of the illumination system 3 and of the projection system 4 can be different in each case. The overall pressure is typically in the range between about $10^{-9}$ mbar and about $10^{-1}$ mbar. Outside the beam-shaping system 2, the illumination system 3 and the projection system 4, or outside the EUV lithography apparatus 1, there is typically an atmospheric pressure environment 17 with a typically much higher pressure.

In the example shown, the cleaning head 15 is secured on a vacuum linear feed-through 20 which allows the cleaning head 15 to be moved inside the vacuum environment 16 in the X direction of an XYZ coordinate system and therefore along the surface 13a that is to be cleaned and that likewise extends in the X direction, as indicated by the double-headed arrow in FIG. 1. It will be appreciated that, by using the vacuum linear feed-through 20, other components, for example sensors, measuring devices, etc., can also be moved using a linear reciprocating motion inside the vacuum environment 16.

Figure 2:
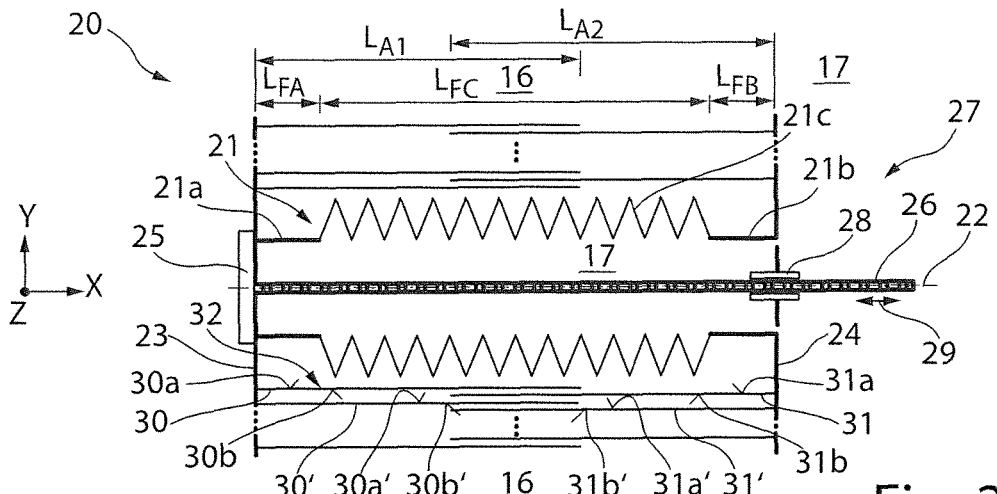
FIG. 2 shows a schematic view of a vacuum linear feed-through with several pairs of first and second cylindrical shields.

FIG. 2 shows an illustrative embodiment of the vacuum linear feed-through 20 from FIG. 1 in a longitudinal section. The vacuum linear feed-through 20 has a vacuum diaphragm bellows 21 which, along its longitudinal direction X, has a first rigid end 21a, a second rigid end 21b opposite the first end 21a, and, between the first end 21a and second end 21b, a partial region 21c which has a plurality of folds or corrugations and of which the length is variable, i.e. it can be expanded and contracted. In the example shown, the vacuum diaphragm bellows 21 is made of stainless steel and is rotationally symmetrical with respect to its longitudinal axis 22, i.e. the vacuum diaphragm bellows 21 has a substantially cylindrical basic shape.

At the first end 21a, the vacuum diaphragm bellows 21 is connected to a first plane base plate 23 of, for example, circular geometry. Correspondingly, at its second end 21b, the vacuum diaphragm bellows 21 is connected to a second plane base plate 24 which, in the example shown, likewise has a circular geometry. A mechanical interface or a mechanical fastening device 25 is mounted on the first base plate 23 and serves for the attachment of the cleaning head 15 shown in FIG. 1 or, if appropriate, of other components. The second base plate 24 can be connected to the vacuum housing 4 of FIG. 1 through suitable fastening elements, for example a screw connection or the like. In the vacuum housing 4, an opening is typically formed in the area of the vacuum linear feed-through 20 in order to be able to act on this from the atmospheric environment 17 after the vacuum linear feed-through 20 has been fastened.

In the second base plate 24, in the area of the longitudinal axis 22 of the vacuum diaphragm bellows 21, a cylindrical linear guide 28 is mounted which forms a part of an actuator device 27 and which serves to guide a rod 26 of the actuator device 27. At one end, the rod 26 is rigidly connected to the first end 21a of the vacuum diaphragm bellows 21, to be more exact to the first base plate 23, on which the first end 21a of the vacuum diaphragm bellows 21 is fastened. The rod 26, and therefore the first end 21a of the vacuum diaphragm bellows 21, can be moved in the longitudinal direction, i.e. in the X direction, by an actuator 29 of the actuator device 27, for example by an electric motor, which is indicated in FIG. 2 by a double-headed arrow. Correspondingly, the cleaning head 15 mounted on the mechanical interface 25 is also moved relative to the stationary second end 21a of the vacuum diaphragm bellows 21.

As can be seen in FIG. 2, through-openings are provided in the second base plate 25 eccentrically with respect to the longitudinal axis 22 of the vacuum diaphragm bellows 21, in order to connect the volume area formed inside the vacuum diaphragm bellows 21 to the atmosphere side 17 of the vacuum linear feed-through 20. In this way, the atmosphere side 17 of the vacuum linear feed-through 20 also extends into the volume area delimited in the radial direction by the vacuum diaphragm bellows 21 and in the axial direction by the first and second base plates 23, 24. The vacuum side 16 of the vacuum diaphragm bellows 21 is formed radially outward, i.e. it surrounds the vacuum diaphragm bellows 21 in the radial direction.

It will be appreciated that, instead of a second base plate 24, a partial region of the vacuum housing 2 can, if appropriate, serve for the attachment of the vacuum diaphragm bellows 21. In this case the vacuum linear feed-through 20 is integrated rigidly in the vacuum housing 4 of the EUV lithography apparatus 1, and the second end 21b of the vacuum diaphragm bellows 21 is connected directly to the partial region of the vacuum housing 4.

FIG. 2 shows the vacuum diaphragm bellows 21 in its position of maximum expansion, from which a linear reciprocating motion takes place toward the right, i.e. in the positive X direction, as a result of which the vacuum diaphragm bellows 21, more exactly the partial region 21c with the folds, is compressed and the length $L_{FC}$ shown in FIG. 2 decreases. It will be appreciated that the lengths $L_{FA}$ and $L_{FB}$ of the first and second rigid end 21a, 21b, respectively, of the vacuum diaphragm bellows 21 remain constant in the linear reciprocating motion of the vacuum diaphragm bellows 21.

As can likewise be seen in FIG. 2, several cylindrical first shields 30, 30', etc. are arranged on the vacuum side 16 of the vacuum diaphragm bellows 21, i.e. lie radially to the inside, and are connected at one end to the first end 21a of the vacuum diaphragm bellows 21 via the first base plate 23. Correspondingly, several second shields 31, 31' are arranged on the vacuum side 16 of the vacuum diaphragm bellows 21 and are connected to the second end 21b of the vacuum diaphragm bellows 21 via the second base plate 24. The first and second shields 30, 30' and 31, 31' annularly surround the vacuum diaphragm bellows 21.

A respective first shield 30, 30', etc. has a length $L_{A1}$ which, in the example shown, is the same as a length $L_{A2}$ of a respective second shield 31, 31', etc. The first and second shields 30, 30' and 31, 31' are rigid, i.e. they do not change their length $L_{A1}$, $L_{A2}$ during the linear reciprocating motion.

In the position of complete expansion of the vacuum diaphragm bellows 21 shown in FIG. 2, a respective first shield 30, 30', etc. overlaps a respective second shield 31, 31', etc. along a partial extent of the total length $L_{FA}+L_{FB}+L_{FC}$ of the vacuum diaphragm bellows 21, i.e. the length $L_{A1}$, $L_{A2}$ of the first and second shields 30, 30' and 31, 31' is in each case greater than half the total length $L_{FA}+L_{FB}+L_{FC}$ of the completely expanded vacuum diaphragm bellows 21. In the contraction of the vacuum diaphragm bellows 21 by the movement of the first end 21a toward the right, or in the positive X direction, the length of the partial region in which the first and second shields 30, 30' and 31, 31' overlap increases.

The partial region in which the first and second shields 30, 30' and 31, 31' overlap prevents a line of sight being formed between the vacuum diaphragm bellows 21 and the vacuum side 16. Particles that may be released from the vacuum diaphragm bellows 21 during the reciprocating motion can only get into the vacuum environment 16 through a gap formed between the overlapping, adjacent first and second shields 30, 30' and 31, 31', such that the chance of particles passing through into the vacuum environment 16 can be greatly reduced.

In the vacuum linear feed-through 20 of FIG. 2, and as indicated by dots in FIG. 2, several pairs of first and second shields 30, 31, 30', 31 are arranged in the radial direction from the inside outward and each overlap in the longitudinal direction X of the vacuum diaphragm bellows 21, such that a gap is formed between adjacent shields 30, 31, 30', 31' of the respective pairs. Through the provision of several overlapping first and second shields 30, 30' and 31, 31', a particle labyrinth is formed which greatly reduces the chance of particles passing through from the vacuum diaphragm bellows 21 into the vacuum environment 16 as compared with the provision of a single pair of shields 30, 31. The number of first and second shields 30, 31; 30', 31' etc. used in the vacuum linear feed-through 20 defines the strength of the particle suppression.

In the example shown in FIG. 2, the effectiveness of the particle suppression can be increased by applying an adhesive coating 32 to a surface 30a, 30a', directed toward the vacuum diaphragm bellows 21, and/or a surface 30b, 30b', directed away from the vacuum diaphragm bellows 21, of a respective first shield 30, 30'. Correspondingly, the effectiveness of the particle suppression can be increased if an adhesive coating 32 is applied to a surface 31a, 31a', directed toward the vacuum diaphragm bellows 21, and/or a surface 31b, 31b', directed away from the vacuum diaphragm bellows 21, of a respective second shield 31, 31', as is shown in FIG. 2. The material of the coating 32, which serves for the adhesion of the particles released by the vacuum diaphragm bellows 21, can be an acrylic-based vacuum-compatible coating, for example.

Figure 3:
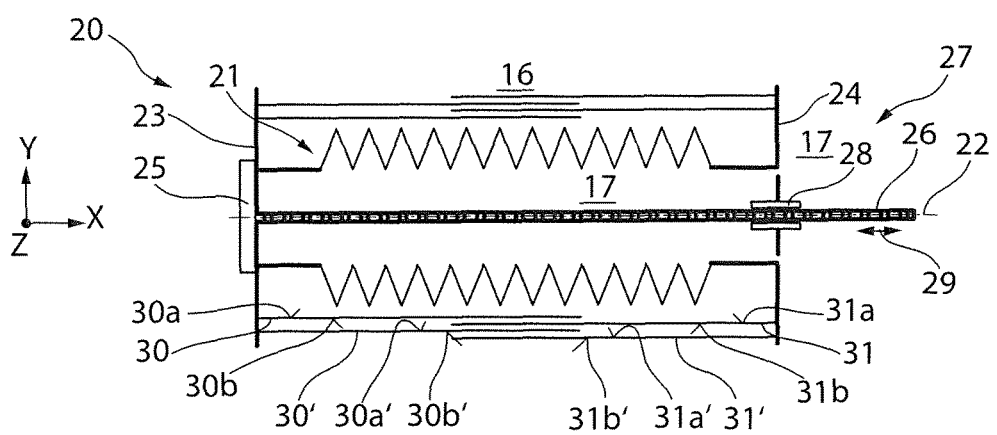
FIG. 3 shows a schematic view of a vacuum linear feed-through with a pair of first and second shields, which are formed of a permanently magnetic material, and with a further pair of first and second shields, which are formed of a paramagnetic material.

FIG. 3 shows a vacuum linear feed-through 20 in which, in order to increase the effectiveness of the particle suppression, a first shield 30, which is arranged immediately adjacent to the vacuum diaphragm bellows 21, and a second shield 31, which is arranged radially farther out than the first shield 30 and partially overlaps the first shield 30 in the longitudinal direction, are each formed of a permanently magnetic material. In the example shown, the permanently magnetic material is a permanently magnetic steel, i.e. martensitic steel or ferritic steel. Magnetic or magnetizable particles released by the vacuum diaphragm bellows 21 are attracted by the permanently magnetic material of the respective first and second shields 30, 31 and remain adhering to the first and second shields 30, 31. In the example shown in FIG. 3, it is expedient if the vacuum diaphragm bellows 21 itself, or at least the partial region 21c thereof with the folds, is formed of a permanently magnetic or of a magnetizable material, e.g. ferritic or martensitic steel, since the particles released by such a vacuum diaphragm bellows 21 typically have magnetic properties. The chosen (ferritic or martensitic) steels should be corrosion-resistant and have suitable mechanical properties.

To avoid a situation where the permanent magnetic field generated by the first and second shields 30, 31 extends into the area of the vacuum environment 16, the example shown in FIG. 3 is provided with a further first shield 30' and a further second shield 31', which are arranged lying radially to the outside of the first and second shields 30, 31. In the example shown, the first and second further shields 30', 31' are composed of a paramagnetic material, specifically a mu-metal. On account of the very high magnetic permeability of the mu-metal, the two further shields 30', 31' can effectively shield the static magnetic field generated by the first and second shields 30, 31 or by the vacuum diaphragm bellows 21.

In the example shown in FIG. 3, only two first shields 30, 30' and two second shields 31, 31' are needed in order to achieve strong particle reduction. The installation space needed to realize the vacuum linear feed-through 20 shown in FIG. 3 is greatly reduced by comparison with the example shown in FIG. 2 in which more than two pairs of shields 30, 30', 31, 31' are typically used. It will be appreciated that, if appropriate, the shields 30, 30' and 31, 31' shown in FIG. 3, or more exactly their surfaces 30a, 30b, 30a', 30b', 31a, 31b, 31a', 31b', can also be provided with an adhesive coating 32 in order to further increase the effectiveness of the particle reduction.

Figure 4:
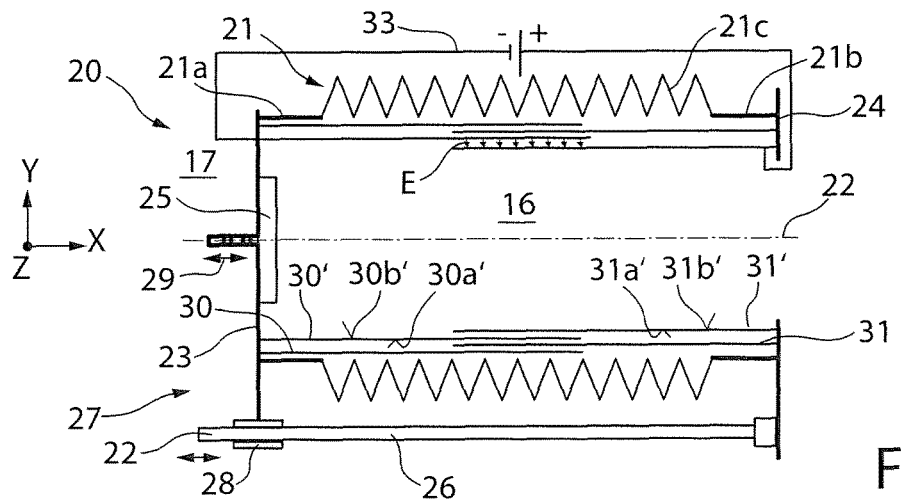
FIG. 4 shows a schematic view of a vacuum linear feed-through analogous to FIG. 3 with a voltage-generating device for generating an electric field between a first and a second shield.

FIG. 4 finally shows an example of a vacuum linear feed-through 20 in which the vacuum side 16 is arranged lying radially to the inside with respect to the vacuum diaphragm bellows 21 and the atmosphere side 17 is arranged lying radially to the outside. In order to realize the linear reciprocating motion in this case, the rod 26 and the linear guide 28, on which the rod 26 is guided, are arranged eccentrically with respect to the longitudinal axis 22 of the vacuum diaphragm bellows 21, in contrast to what is shown in FIG. 2 and FIG. 3. Moreover, the rod 26 is connected not to the first end 21a but instead to the stationary second end 21b of the vacuum diaphragm bellows 21, more precisely to the second base plate 24.

The linear guide 28 is secured on the first end 21a of the vacuum diaphragm bellows 21, more precisely on the first base plate 23, and is linearly displaced with the latter when an actuator 29 acts on the first end 21a of the vacuum diaphragm bellows 21. In the example shown, the actuator 29 acts on the first base plate 23 directly or via a further rod in order to move the first end 21a of the vacuum diaphragm bellows 21 in the X direction. In the example shown, a relatively large opening is formed in the second base plate 24, or in the associated vacuum housing 4, and connects the radially inward volume area of the vacuum diaphragm bellows 21 to the vacuum environment 16 in the interior of the vacuum housing 4. In the illustrative embodiment shown in FIG. 4, there is typically no cleaning head 15 but instead another component, e.g. a sensor or the like, secured on the mechanical interface 25 in order to be driven linearly.

In the example shown in FIG. 4, the vacuum linear feed-through 20 additionally has a voltage-generating device 33 (voltage source) which generates an electrical voltage dropping between the first paramagnetic shield 30' and the second paramagnetic shield 31'. The voltage-generating device 33 thus generates an electric field E in the overlap area between the first paramagnetic shield 30' and the second paramagnetic shield 31'. Since the shields 30', 31' are cylindrical, the field lines of the electric field E run in the radial direction, such that the particles present between the first and second paramagnetic shield 30', 31' are accelerated toward the mutually facing surfaces 30b', 31a' of the two paramagnetic shields 30', 31', and the impact probability and the impact energy of the particles increases. It will be appreciated that the two paramagnetic shields 30', 31' have to be electrically insulated from the vacuum diaphragm bellows 21 if a voltage is applied between these.

As an addition or an alternative to generating an electric field E in the gap between the first and second paramagnetic shield 30', 31', it is also possible for an electric field to be generated between the first and second permanently magnetic shields 30, 31 with the voltage-generating device 33. It will be appreciated that generating an electric field E with the aid of a voltage-generating device 33 is also possible in the vacuum linear feed-throughs 20 described above in connection with FIG. 2 and FIG. 3.

In summary, the admission of particles into the vacuum environment 16, caused by the reciprocating motion of the vacuum diaphragm bellows 21, can be greatly reduced in the manner described above, i.e. by the use of the shields 30, 31, 30', 31', etc. It will be appreciated that the vacuum linear feed-through 20 described above can be used not only in an EUV lithography system 1 but also in other vacuum systems 20 in order to reduce introduction of particles into a vacuum environment 16.

What is claimed is:

1. A vacuum linear feed-through, comprising:
   a vacuum diaphragm bellows, which has a first end configured to attach to a component and a second end, opposite the first end, configured to attach to a vacuum housing,
   an actuator device configured to generate a linear reciprocating motion of the vacuum diaphragm bellows in directions extending along a longitudinal axis of the vacuum diaphragm bellows,
   at least one first shield, which is connected to the vacuum diaphragm bellows at the first end, and
   at least one second shield, which is connected to the vacuum diaphragm bellows at the second end,
   wherein the at least one first shield and the at least one second shield annularly surround the vacuum diaphragm bellows, and overlap one another along the longitudinal axis of the vacuum diaphragm bellows, and
   wherein at least one of: (a) the at least one first shield and the at least one second shield are formed of a permanently magnetic material, and (b) the vacuum linear feed-through comprises a voltage-generating device configured to generate an electric field between the at least one first shield and the at least one second shield.

2. The vacuum linear feed-through as claimed in claim 1, wherein the permanently magnetic material is selected from the group consisting essentially of: martensitic steel and ferritic steel.

3. The vacuum linear feed-through as claimed in claim 1, wherein the at least one first shield and the at least one second shield are formed of a paramagnetic material.

4. The vacuum linear feed-through as claimed in claim 3, wherein the paramagnetic material is a mu-metal.

5. The vacuum linear feed-through as claimed in claim 3, wherein the at least one first shield and the at least one second shield made of the permanently magnetic material are arranged between: (a) the at least one first shield and the at least one second shield made of the paramagnetic material and (b) the vacuum diaphragm bellows.

6. The vacuum linear feed-through as claimed in claim 1, wherein the at least one first shield and the at least one second shield each have an adhesive coating on respective surfaces directed toward the vacuum diaphragm bellows and/or directed away from the vacuum diaphragm bellows.

7. The vacuum linear feed-through as claimed in claim 1, wherein the voltage-generating device is configured to generate an electric field between the at least one first shield and the at least one second shield, and wherein the at least one second shield is arranged adjacent to the at least one first shield.

8. The vacuum linear feed-through as claimed in claim 1, wherein the at least one first shield and the at least one second shield are formed as concentrically arranged cylinders.

9. The vacuum linear feed-through as claimed in claim 1, wherein the actuator device has a linear guide configured to guide the vacuum diaphragm bellows in the linear reciprocating motion in the directions along the longitudinal axis of the vacuum diaphragm bellows.

10. The vacuum linear feed-through as claimed in claim 9, wherein the linear guide is arranged eccentrically with respect to the longitudinal axis of the vacuum diaphragm bellows.

11. A vacuum system comprising:
    a vacuum housing configured to form a vacuum environment, and
    at least one vacuum linear feed-through as claimed in claim 1, wherein the second end of the vacuum diaphragm bellows is mounted on the vacuum housing.

12. The vacuum system as claimed in claim 11, which is configured as a lithography system configured to operate with extreme ultraviolet light.

13. The vacuum system as claimed in claim 11, further comprising: a component which is mounted on the first end of the vacuum linear feed-through.

* * * * *

UNITED STATES PATENT AND TRADEMARK OFFICE
CERTIFICATE OF CORRECTION

PATENT NO. : 9,952,519 B2
APPLICATION NO. : 15/481619
DATED : April 24, 2018
INVENTOR(S) : Roos et al.

Page 1 of 1

It is certified that error appears in the above-identified patent and that said Letters Patent is hereby corrected as shown below:

In the Specification

At Column 1, Line 57, delete "multiplicty" and insert -- multiplicity --, therefor.

Signed and Sealed this
Nineteenth Day of November, 2019

Andrei Iancu
*Director of the United States Patent and Trademark Office*